United States Patent
Mei et al.

(10) Patent No.: US 6,531,265 B2
(45) Date of Patent: Mar. 11, 2003

(54) METHOD TO PLANARIZE SEMICONDUCTOR SURFACE

(75) Inventors: Shaw-Ning Mei, Poughkeepsie, NY (US); T. Howard Shillingford, Poughkeepsie, NY (US); Edward J. Vishnesky, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 09/737,240

(22) Filed: Dec. 14, 2000

(65) Prior Publication Data

US 2002/0076653 A1 Jun. 20, 2002

(51) Int. Cl.$^7$ .......................... G03F 7/36; H01L 21/311
(52) U.S. Cl. ...................... 430/314; 430/311; 430/313; 430/316; 430/317; 438/697; 438/700
(58) Field of Search .......................... 430/311, 313, 430/314, 316, 317; 438/697, 700

(56) References Cited

U.S. PATENT DOCUMENTS

| | | | |
|---|---|---|---|
| 4,385,975 A | | 5/1983 | Chu et al. .................... 204/192 |
| 4,836,885 A | | 6/1989 | Breiten et al. ............... 156/643 |
| 5,094,972 A | | 3/1992 | Pierce et al. .................. 437/67 |
| 5,173,439 A | | 12/1992 | Dash et al. ................... 437/67 |
| 5,294,562 A | | 3/1994 | Lur et al. ...................... 437/67 |
| 5,318,687 A | * | 6/1994 | Estes et al. ................... 205/80 |
| 5,385,861 A | | 1/1995 | Bashir et al. ................. 437/67 |
| 5,411,913 A | | 5/1995 | Bashir ......................... 437/67 |
| 5,494,857 A | | 2/1996 | Cooperman et al. ........ 437/228 |
| 5,578,519 A | * | 11/1996 | Cho .............................. 437/67 |
| 5,863,828 A | | 1/1999 | Snyder ....................... 438/437 |
| 5,874,345 A | | 2/1999 | Coronel et al. ............. 438/427 |
| 6,043,133 A | * | 3/2000 | Jang et al. ................... 438/401 |
| 6,093,656 A | * | 7/2000 | Lin ............................. 438/734 |
| 6,228,741 B1 | * | 8/2001 | Walsh et al. ................. 438/400 |
| 6,362,101 B2 | * | 3/2002 | Yang et al. .................. 438/689 |

FOREIGN PATENT DOCUMENTS

EP   300 569 A1   7/1987   ........... H01L/21/76

OTHER PUBLICATIONS

"Shallow Trench Process With Improved Planarization For Integrated Circuits", IBM Tech. Discl. Bull., vol. 32, No. 5B, Oct. 1989, pp. 287–290.

"Method For Planarizing Over Shallow Trenches Filled With Silicon Dioxide", IBM Tech. Discl. Bull., vol. 32, No. 9A, Feb. 1990, pp. 439–440.

(List continued on next page.)

Primary Examiner—Mark F. Huff
Assistant Examiner—Nicole Barreca
(74) Attorney, Agent, or Firm—Anthony J. Canale; Howard J. Walter

(57) ABSTRACT

A method to planarize a semiconductor surface using a Fence Creation and Elimination (FCE) process is described. Shallow recesses on a semiconductor surface are filled with a filling material. The filling material is deposited on the semiconductor surface to a thickness approximately equal to the depth of the shallow recesses. A selectively etchable material is formed on the filling material. A reverse mask (RM) is used to pattern the selectively etchable material to form segments of the selectively etchable material equal to the pattern of the shallow recesses and aligned to the shallow recesses. Exposed filling material is removed followed by the removal of the segments of the selectively etchable material. The remaining filling material in the shallow recesses forms fences which extend above the surface of the semiconductor. The fences are removed resulting in a planar semiconductor surface.

12 Claims, 2 Drawing Sheets

OTHER PUBLICATIONS

"Method To Control Dishing In Chemical–Mechanical Polishing", IBM Tech Disc. Bull., vol. 33, No. 4, Sep. 1990, pp. 223–224.

"Sensitive Surface Damage Avoidance During Polishing", Research Disclosure, Nov. 1991, No. 331.

"Dishing effects in a chemical mechanical polishing planarization process for advanced trench isolation", by C. Yu, et al., Appl. Phys. Lett., vol. 61, No. 11, Sep. 14, 1992, pp. 1334–1336.

"Planarization of ULSI Topography Over Variable Pattern Densities", by T.H. Daubenspeck, et al., Electrochemical Society, Spring Meeting, May 7, 1989, vol. 89–1, pp. 308–309.

"A Simplified Box (Buried–Oxide) Isolation Technology For Megabit Dynamic Memories", by T. Shibata, et al., IEDM Dec. 1983, pp. 27–30.

"A Practical Trench Isolation Technology With A Novel Planarization Process", by G. Fuse, et al., IEDM, Dec. 1987, pp. 732–735.

"Application of a Two–Layer Planarization Process to VLSI Intermetal Dielectric and Trench Isolation Processes", by D.J. Sheldon, et al., IEEE Transactions On Semiconductor Manufacturing, vol. 1, No. 4, Nov. 1988, pp. 140–146.

"Two–Layer Planarization Process", by A. schiltz, et al., J. Electrochem. Soc.: Solid–State Science and Technology., vol. 133, No. 1, Jan. 1986, pp. 178–181.

"Planarization of ULSI Topography over Variable Pattern Densities", by T.H. Daubenspeck, et al., J. Electrochem. Soc., vol. 138, No. 2, Feb. 1991, pp. 506–509.

"Integration of Chemical–Mechanical Polishing into CMOS Integrated Circuit Manufacturing", by Howard Landis, et al., Thin Solid Films, 220 (1992) 1–7.

* cited by examiner

METHOD TO PLANARIZE SEMICONDUCTOR SURFACE

FIELD OF THE INVENTION

The present invention relates to semiconductor processing. More particularly, it relates to a semiconductor process to planarize a semiconductor surface. Even more particularly, it relates to a semiconductor process to planarize a semiconductor surface using a Fence Creation and Elimination (FCE) planarization process.

BACKGROUND

The process of planarizing a semiconductor surface is important for advanced VLSI (Very Large Scale Integration) technology. A planar semiconductor surface provides a surface free from large variations in topography which reduces process problems associated with forming subsequent devices or layers on the semiconductor surface. Conventional semiconductor surface planarization processes mainly rely on Chemical Mechanical Polishing (CMP). CMP processes introduce defects such as particulate contamination, scratches, and chatter markers. Also, conventional CMP processes introduce "dishing" effects across diverse dimensions resulting in film nonuniformities along the surface of the semiconductor.

SUMMARY OF THE INVENTION

The current invention will describe a method to planarize a semiconductor surface using a Fence Creation and Elimination (FCE) process. Shallow recesses are formed in a semiconductor substrate. A filling material is then deposited on the semiconductor substrate to fill the shallow recesses. The thickness of the filling material is approximately equal to the depth of the shallow recesses. A selectively etchable material is then formed on the filling material. The selectively etchable material is patterned to form segments equal to the pattern of the shallow recesses and aligned with the shallow recesses. The segments of selectively etchable material serve as a mask to define exposed portions of the filling material to be removed. After removal of the exposed portions of the filling material, the segments of selectively etchable material are also removed. The remaining filling material in the shallow recesses forms fences which extend above the semiconductor surface. The fences are removed and results in a planar semiconductor surface.

The advantages of this invention will become apparent from the following detailed description of the presently preferred embodiment of the invention, taken in conjunction with the accompanying drawings.

Figure 1:
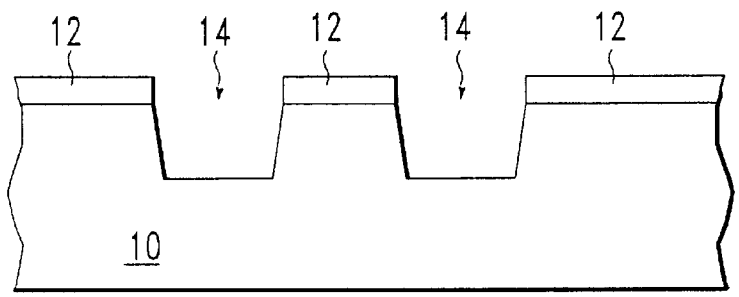
FIG. 1 is a cross-section of the non-planar semiconductor substrate of the present invention showing the shallow recesses created by a prior mask level M1.

In the drawings, the relative thicknesses of the various layers and structure illustrated are not necessarily to scale.

DESCRIPTION OF THE PREFERRED EMBODIMENTS

The present invention is intended to planarize the surface of a semiconductor substrate in VLSI technology. Conventional planarization processes mainly rely on CMP for surface planarization which can introduce one or more defects such as particulate contamination, scratches, chatter markers, or "dishing". Any one of these defects can reduce the yield of the number of good devices on a semiconductor substrate. The present invention eliminates the use of CMP processing and will be described with reference to FIG. 1–7.

FIG. 1 is a cross-section of a semiconductor substrate 10 containing shallow recesses 14 created by a prior masking level M1 (not shown). Photo-resist was patterned on pad film 12 using prior masking level M1 and methods known in the art were used to etch pad film 12 and semiconductor substrate 10 to form shallow recesses 14. According to the present invention, pad film 12 consists of silicon nitride and semiconductor substrate 10 consists of silicon. Shallow recesses 14 can be formed by reactive ion etching silicon nitride pad film 12 and silicon semiconductor substrate using an $NF_3/Ar$ gas mixture.

Figure 2:
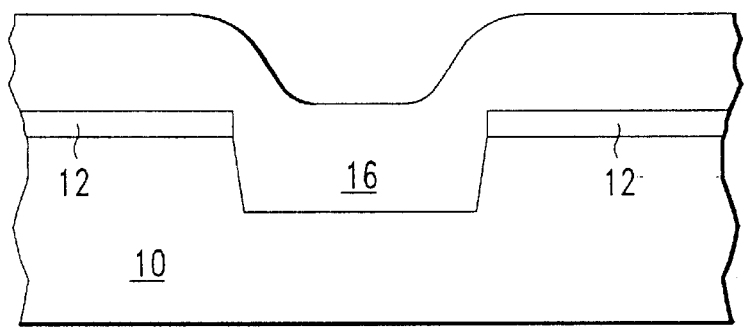
FIG. 2 is a cross-section of a shallow recess shown in FIG. 1 filled with a filling material.

FIG. 2 is a cross section of semiconductor substrate 10 containing one of the shallow recesses 14 shown in FIG. 1. Filling material 16 is deposited on pad film 12 and has a thickness so that it fills shallow recess 14 equal to a depth slightly above shallow recess 14. Filling material 16 is deposited by methods well known in the art such as low pressure chemical vapor deposition (LPCVD). Filling material 16 has a high etch rate compared to pad film 12 when exposed to a subsequent reactive ion etch using $CHF_3/He/O_2$ gas. Further, filling material 16 has relatively good gap fill properties such that seams in shallow recess 14 are avoided. For the silicon nitride pad film 12 used in the present invention, a filling material 16 consisting of oxide meets the above mentioned etch selectivity and gap fill requirements.

Figure 3:
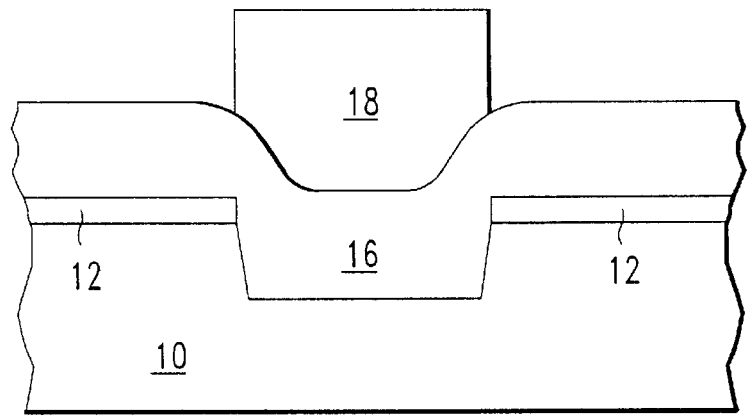
FIG. 3 shows a selectively etchable material on the filling material and aligned with the shallow recess.

FIG. 3 shows a segment of selectively etchable material 18 formed on filling material 16 over shallow recess 14. According to the present invention, selectively etchable material 18 consists of photo-resist and can be patterned by photolithographic methods known in the art to form the segment shown in. Photo-resist selectively etchable material 18 is patterned using a reverse mask (RM) which is generated by either the reverse of the prior level mask M1 with some image size compensation or using the same M1 mask with negative photo-resist. Selectively etchable material 18 is patterned in such a way that it is substantially equal to the pattern of shallow recesses 14 and substantially aligned with shallow recesses 14. Selectively etchable material 18 defines the regions where underlying filling material 16 will be removed by a subsequent etch process.

Figure 4:
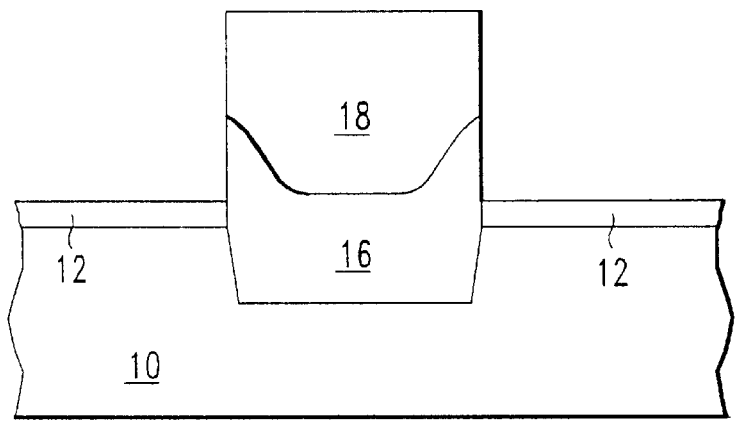
FIG. 4 shows the removal of the exposed portions of the filling material.

FIG. 4 illustrates the removal of filling material 16 from regions not protected by selectively etchable material 18 by etch methods known in the art such as an-isotropic reactive ion etching using $CHF_3/He/O_2$ gas. A reactive ion etch using $CHF_3/He/O_2$ gas will etch oxide filling material 16 at a higher etch rate than both photo-resist selectively etchable material 18 and silicon nitride pad film 12 so that sufficient over-etch can be done to ensure removal of the exposed oxide filling material 16.

Figure 5:
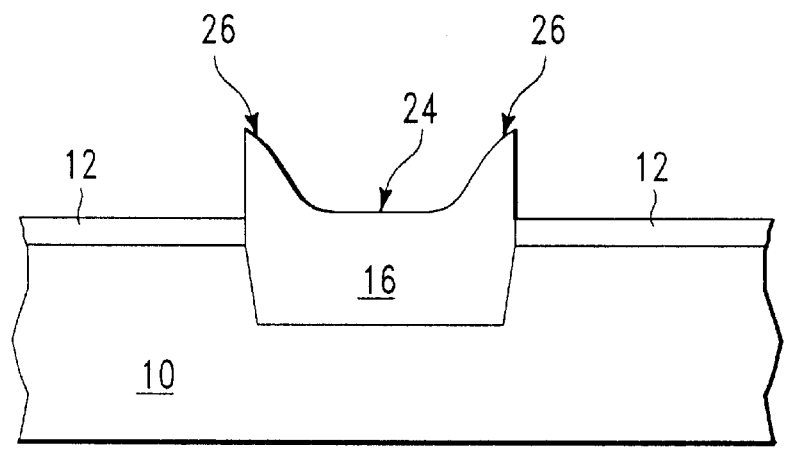
FIG. 5 shows the removal of the selectively etchable material and the remaining filling material.

Photo-resist selectively etchable material 18 is removed by methods known in the art such as an oxygen ash leaving remaining filling material 16 as shown in FIG. 5. The remaining oxide filling material 16 is then etched by methods known in the art such as an HF wet etch to remove the fences 26 formed by the previous processing steps and etch the surface 24 to a level substantially planar with the top surface of silicon nitride pad film 12.

Figure 6:
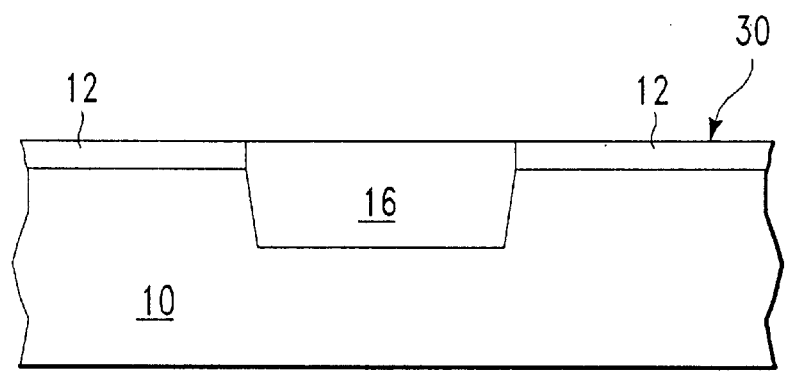
FIG. 6 shows the planarized semiconductor substrate achieved by the method of the present invention.

FIG. 6 shows the resulting planarized surface 30 of the semiconductor substrate 10 formed by the method of the present invention.

Figure 7:
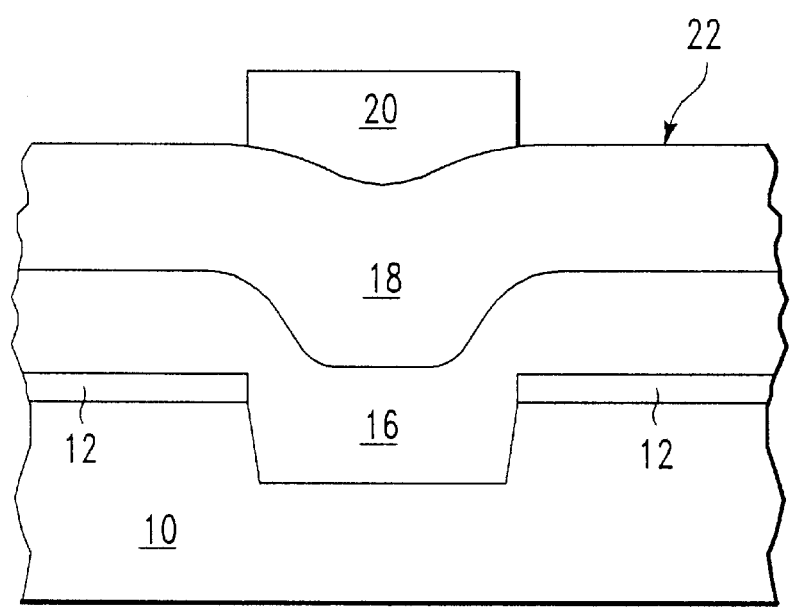
FIG. 7 shows a selectively etchable material formed on the filling material, and a photo-resist patterned on the selectively etchable material according to a second embodiment of the present invention.

In a second embodiment, polysilicon can be used instead of photo-resist for selectively etchable material 18. As shown in FIG. 7, polysilicon selectively etchable material 18 is formed on oxide filling material 16 by methods known in the art such as low pressure chemical vapor deposition (LPCVD) in a batch furnace or by chemical vapor deposition (CVD) in a single-wafer tool. Polysilicon selectively etchable material 18 is formed to a thickness such that surface 22 is substantially planar. Photo-resist is patterned on polysilicon selectively etchable material 18 in the same manner as described in the first embodiment using a reverse mask (RM). An anisotropic reactive ion etch using an HBr/Cl gas will etch the exposed polysilicon selectively etchable material 18 at a higher etch rate than both photo-resist 20 and oxide filler material 16 so that sufficient over-etch can be done to ensure removal of the exposed polysilicon. Photo-resist 20 is then removed by methods known in the art such as an oxygen ash. Remaining polysilicon selectively etchable material 18 is similar to that of the first embodiment shown in FIG. 3. Referring to FIG. 4, oxide filler material 16 is removed in the same manner as described in the first embodiment. An anisotropic reactive ion etch using CHF3/He/O2 gas will etch oxide filling material 16 at a higher etch rate than polysilicon selectively etchable material 18. Polysilicon selectively etchable material 18 is then removed by methods known in the art such as an isotropic reactive ion etch using SF6 gas as shown in FIG. 5. An isotropic reactive ion etch using SF6 gas will etch polysilicon selectively etchable material 18 at a higher etch rate than both oxide filling material 16 and silicon nitride pad film 12 so that sufficient over-etch can be done to ensure removal of polysilicon selectively etchable material 18. Remaining oxide filling material 16 is similar to that described in the first embodiment and is removed in the same manner as described in the first embodiment.

In a third embodiment, polysilicon selectively etchable material 18 of FIG. 5 of the second embodiment can be removed using a potassium hydroxide (KOH) wet etch.

In a fourth embodiment, shallow recesses 14 can be shallow trenches used for electrical isolation, or holes for inter-level contacts.

In a fifth embodiment, polysilicon can be used as filling material 16 as shown in FIG. 2. Photo-resist selectively etchable material 18 is patterned on polysilicon filling material 16 as shown in FIG. 3. Referring to FIG. 4, an anisotropic reactive ion etch using an HBr/Cl gas can be used to etch polysilicon filling material 16 at a higher etch rate than both photo-resist selectively etchable material 18 and silicon nitride pad film 12 so that sufficient over-etch can be done to ensure removal of the exposed polysilicon filling material 16. Photo-resist selectively etchable material 18 is then removed using an oxygen ash as described in the first embodiment. FIG. 5 shows remaining polysilicon filling material 16 and polysilicon fences 26. A KOH wet etch can be used to remove polysilicon fences 26 to obtain planarized surface 30 of semiconductor substrate 10 shown in FIG. 6.

It should be understood that the invention is not limited to the illustrated method of Fence Creation and Elimination (FCE) planarization. Further, the invention can be embodied by adding a variety of improvements, modifications, and changes, based on knowledges of those skilled in the art within a scope that does not deviate from the essentials of the invention. Thus, a variety of embodiments for the method of planarizing a semiconductor surface related to the present invention have been described by referring to the drawings.

What is claimed is:

1. The method of filling shallow recesses in a semiconductor substrate comprising the steps of:

depositing a filling material, on a substrate containing recesses, to a thickness equal to or greater than the depth of the recesses;

forming a pattern of selectively etchable material having segments substantially equal to the pattern of said recesses and substantially aligned therewith;

selectively removing exposed portions of said filling material;

removing said selectively etchable material; and selectively etching said filling material using an abrasive-free process to remove filling material which extends substantially above the surface of said substrate.

2. The method of claim 1, wherein said filling material is oxide or polysilicon.

3. The method of claim 1, wherein said filling material is deposited by LPCVD.

4. The method of claim 1, wherein said recesses comprise shallow trenches for electrical isolation, or holes for inter-level contacts.

5. The method of claim 1, wherein said selectively etchable material is photo-resist or polysilicon.

6. The method of claim 1, wherein said pattern of selectively etchable material is defined by using photolithography.

7. The method of claim 1, wherein said exposed portions of said filling material are selectively removed using an anisotropic dry etch process.

8. The method of claim 7, wherein said anisotropic dry etch process comprises CHF3/He/O2 gas or HBr/Cl gas.

9. The method of claim 1, wherein said selectively etchable material is removed using an isotropic dry etch process.

10. The method of claim 9, wherein said isotropic dry etch process comprises an oxygen ash or SF6 gas.

11. The method of claim 1, wherein said selectively etchable material is removed using a wet etch process comprising KOH.

12. The method of claim 1, wherein said filling material which extends substantially above the surface of said substrate is selectively etched using a wet etch process comprising HF or KOH.

* * * * *